United States Patent [19]
Niiranen

[11] Patent Number: 5,717,368
[45] Date of Patent: Feb. 10, 1998

[54] VARACTOR TUNED HELICAL RESONATOR FOR USE WITH DUPLEX FILTER

[75] Inventor: Erkki Niiranen, Saukonkuja, Finland

[73] Assignee: LK-Products Oy, Kempele, Finland

[21] Appl. No.: 746,675

[22] Filed: Nov. 14, 1996

Related U.S. Application Data

[63] Continuation of Ser. No. 303,326, Sep. 9, 1994, abandoned.

[30] Foreign Application Priority Data

Sep. 10, 1993 [FI] Finland ................................ 933988

[51] Int. Cl.⁶ ........................................................ H01P 1/20
[52] U.S. Cl. ............................ 333/202; 333/175; 333/176
[58] Field of Search ................................. 333/176–180, 333/202–207, 174–175; 455/195.1, 197.1, 340

[56] References Cited

U.S. PATENT DOCUMENTS

| | | | |
|---|---|---|---|
| 3,733,608 | 5/1973 | McGhay et al. | 333/134 |
| 4,182,997 | 1/1980 | Brambilla | 333/202 |
| 4,426,630 | 1/1984 | Folkmann | 333/174 |
| 4,459,571 | 7/1984 | Fraser | 333/202 |
| 4,662,001 | 4/1987 | Cruz et al. | |
| 4,682,131 | 7/1987 | May | 333/202 |
| 4,714,906 | 12/1987 | D'Aberet et al. | 333/202 |
| 4,799,034 | 1/1989 | Silverman et al. | 333/202 |
| 5,065,453 | 11/1991 | Thomas | 333/176 |
| 5,107,233 | 4/1992 | Stoft | 333/174 |
| 5,227,748 | 7/1993 | Sroka | 333/207 |

FOREIGN PATENT DOCUMENTS

| | | |
|---|---|---|
| 0 472 319 A1 | 2/1992 | European Pat. Off. ......... H03H 7/01 |
| 0472319 | 2/1992 | European Pat. Off. |
| 0481607 | 4/1992 | European Pat. Off. |
| 86014 | 3/1992 | Finland |
| 933988 | 7/1994 | Finland |
| 960280 | 6/1964 | United Kingdom |

OTHER PUBLICATIONS

Patent Abstracts of Japan, Publication No. JP1089709, published Apr. 4, 1989, page 1 of 1.

*Primary Examiner*—Robert Pascal
*Assistant Examiner*—Darius Gambino
*Attorney, Agent, or Firm*—Darby & Darby

[57] ABSTRACT

A radio frequency filter comprising several resonator circuits, such as duplex filter, is provides with a given passband. Signal frequencies generating spurious response, mirror frequencies, etc. can be effectively attenuated so that the filter comprises one more resonator circuit connected as a bandstop circuit. That comprises a transmission line resonator (Res), a series connection of an inductive element (MLIN2) and a capacitance diode (D), one end of the series connection being couples to a coupling point in the transmission line resonator, dividing it into two parts (TLIN1, TLIN2), and the other end being couples to the output connector (1) of the radio frequency filter. In addition, means are provided for carrying the direct voltage (V+) to the cathode of the capacitance diode, whereby the series resonance frequency changes according to the control voltage.

11 Claims, 3 Drawing Sheets

VARACTOR TUNED HELICAL RESONATOR FOR USE WITH DUPLEX FILTER

This is a continuation, of application Ser. No. 08/303, 326, filed Sep. 9, 1994, now abandoned.

FIELD OF THE INVENTION

The present invention relates to a radio frequency filter, in particular a filter for attenuating spurious responses from a receiver mixer of a radio telephone.

BACKGROUND OF THE INVENTION

In radio talephones, a received radio signal is usually coupled from an antenna to a duplex filter from where it is passed through a first amplifier located in the front end of the receiver. The received signal is then passed through a fixed bandpass filter to a first mixer where it is mixed with a local oscillator frequency, to yield an intermediate frequency which is filtered from the general mixer response. The intermediate frequency signal is amplified prior to be taken to a second mixer. To reduce component costs and to simplify the basic structure of a receiver, it would be advantageous to select a low intermediate frequency. However, the selection of a low intermediate frequency, may cause difficulties not solvable by means of fixed filters. For example, the attenuation of signals such as local oscillator signals, which are at a distance of the intermediate frequency from a signal to be received and mirror frequency signals, which are at twice the distance of the intermediate frequency from the receiving band, may be difficult to achieve.

A spurious response signal is generally higher than the received Rf signal by half of the intermediate frequency if the local oscillator injection frequency is located on the upper side of the received signal (the local oscillator frequency is higher than the frequency to be received). Conversely it is half of the intermediate frequency lower than the received Rf signal if the local oscillator injection signal is located on the lower side of the received signal (the local oscillator frequency is lower than the frequency to be received).

When the intermediate frequency is sufficiently high relative to the receiving band, i.e. higher by at least twice the width of the reception band, the frequency components generating a spurious response can be filtered by means of fixed filters in the high frequency components of the receiver. For this purpose, the first intermediate frequency is in general selected to be sufficiently high, as described above, although the components to be used are more difficult to produce and therefore more expensive. For example, in the NMT radio telephone system, the width of the receiving band is 25 MHz end the intermediate frequency over 50 MHz. e.g, 87 MHz. In certain radio telephone systems attenuation required in the telephone to overcome the spurious response is so high that the receiver will not operate according to the specifications of the system without a separate system specifically to attenuate the spurious response cause by the harmonic components.

The problem related to spurious response particularly arises in the upper end of the receiving band. When a receiver is listening at the lower end of the receiving band, the spurious response frequencies are created in the upper end of the receiving band where the front end filters are not provided with any attenuation. If in said frequency range e powerful signal occurs, a harmful spurious response is generated in the mixer. In the worst instance, this inhibits the entire listening or understanding of the desired received signal. If, as in the above example, the width of the receiving band in an NMT phone is 25 MHz and, if the intermediate frequency is below 2*25 MHz, i.e. below 50 MHz, a detrimental spurious response is created the frequency of which spurious signal being located in the upper end of the receiving band. When the signal frequency to be received is located at the upper end of the receiving frequency band, the frequency created by the spurious response moves outside the receiving band, and the fixed filters prior to the mixer are capable of removing the spurious response. Thus, problems arise particularly when the receiver is tuned to be in the lower range of the receiving band and the signals causing spurious response are located in the upper range of the receiving band.

The generation of a spurious response in a mixer is easiest to avoid by selecting a sufficient Intermediate frequency, i.e. twice the band width of the receiver band, whereby the signal creating spurious response will not occur in the listening range of the receiver.

Signals creating a spurious response may be reduced by using a controllable filter after the RF amplifier, however, such a filter is currently not commerically available.

The properties of the mixer may also be enhanced or improved but more expensive filters could be used. A separate suction filter can be used which is coupled between the RF signal mute and the earth of the apparatus prior to the mixer of the receiver. Such a suction filter like that is disclosed in patent FI-86014. Therein, the suction filter is a resonator, e.g. a helical resonator, the resonance frequency whereof being controllable with the control voltage of a capacitance diode included in the circuit. The value of the control voltage changes with a change in receiving channel in that together with the increasing frequency of the receiving channel, the resonance frequency of the resonator increases.

The Finnish patent application FI-902149 also discloses a useful circuit. It includes a resonance circuit coupled before the intermediate amplifier between the signal route and the earth of the circuit. The resonance circuit is at series resonance at a frequency half of the intermediate frequency, whereby a signal of said frequency is strongly attenuated, and in parallel resonance when the frequency is an intermediate frequency so that the attenuation of a signal at said frequency is not significant. The resonator circuit comprises an inductance and capacitance connected in parallel, and a series capacitance. The circuit is at series resonance at a frequency half of the intermediate frequency, e.g. at 22.5 MHz frequency when using a 45 MHz intermediate frequency. Hereby, the impedance of the resonance circuit is very low, and the 22.5 MHz frequency component is powerfully attenuated before the amplifier, and the other harmonics visible in the output of the amplifier is therefore so small that the spurious response requirement specified by the specification is met. The same resonance circuit is in parallel resonance at an intermediate frequency, e.g. 45 MHz, so that the impedance thereof is very high, thus not attenuating the intermediate frequency signal. Said design is appropriate for use when a phone is designed to meet a given specification. With a changed specification, the resonance circuit has to be dimensioned once again. It is furthermore to be noted that the circuit is intended for a signal of intermediate frequency.

It is known in the art that the capacitance of the interface of the semiconductor of a capacitance diode can be controlled with a reverse direct voltage. The capacitance of the capacitance diode decreases as the direct voltage crossing the interface increases, and vice versa. It is to be noted that the capacitance diode is biassed in a reverse direction, in other words, the voltage across the diode is reverse relative to the interface of the diode, whereby no direct current travels therethrough, and no power is consumed thereby. Therefore, the capacitance diode, or varactor, is used widely as a voltage-controlled capacitance.

A duplex filter comprising a transmitter filter Tx coupled to a transmitter branch and a receiver filter coupled to a receiver branch. The filters can be of bandstop or bandpass type, or combinations thereof, typically implemented with transmission line resonators, such as coaxial or helical resonators.

SUMMARY OF THE INVENTION

In accordance with the present invention them is provided a radio frequency filter comprising a resonator coupled thereto and adaptable to be a band stop filter, said band stop filter being tunable to attenuate signals in a pass band region of said radio frequency filter.

In a circuit in accordance with the present invention, one of the resonators in a Rx part of a duplex filter has been coupled into a bandstop type circuit and positioned as far as possible from the antenna gate. The circuit operates at radio frequency and it is characterized in that it passes the signals above and below the series resonance frequency thereof nearly unattenuated. It has been so implemented that the resonator has been divided into two parts. The point between the parts has been coupled via a capacitance diode and an inductance in series therewith to the main circuit of the duplex filter. A signal to be received from the antenna is fed via the other resonators of the filter through an adaption element, such as microstrip, to a point whereto the circuit of the invention has been coupled and which may also at the same time form the output gate for the Rx of the filter.

The circuit can been so sized that the series resonance of the bandstop circuit is located above the receiving band and the frequency of the circuit can be controlled. While in the series resonance, the circuit attenuates the resonance frequency signal, and by positioning the zero point by half of the intermediate frequency above the receiving frequency (in case of an upper local oscillator injection) or below the receiving frequency (in case of lower local oscillator injection), the signal generating spurious response can be attenuated as early as In the duplex filter.

A further advantage of the present invention is that no or few extra circuit components are required in the filter, thereby reducing costs and manufacturing complexity.

BRIEF DESCRIPTION OF THE DRAWINGS

FIG. 3 presents the amplitude response of a duplex filter when using the circuit of

FIG. 1,

DETAILED DESCRIPTION OF EMBODIMENTS OF THE INVENTION

Figure 1:
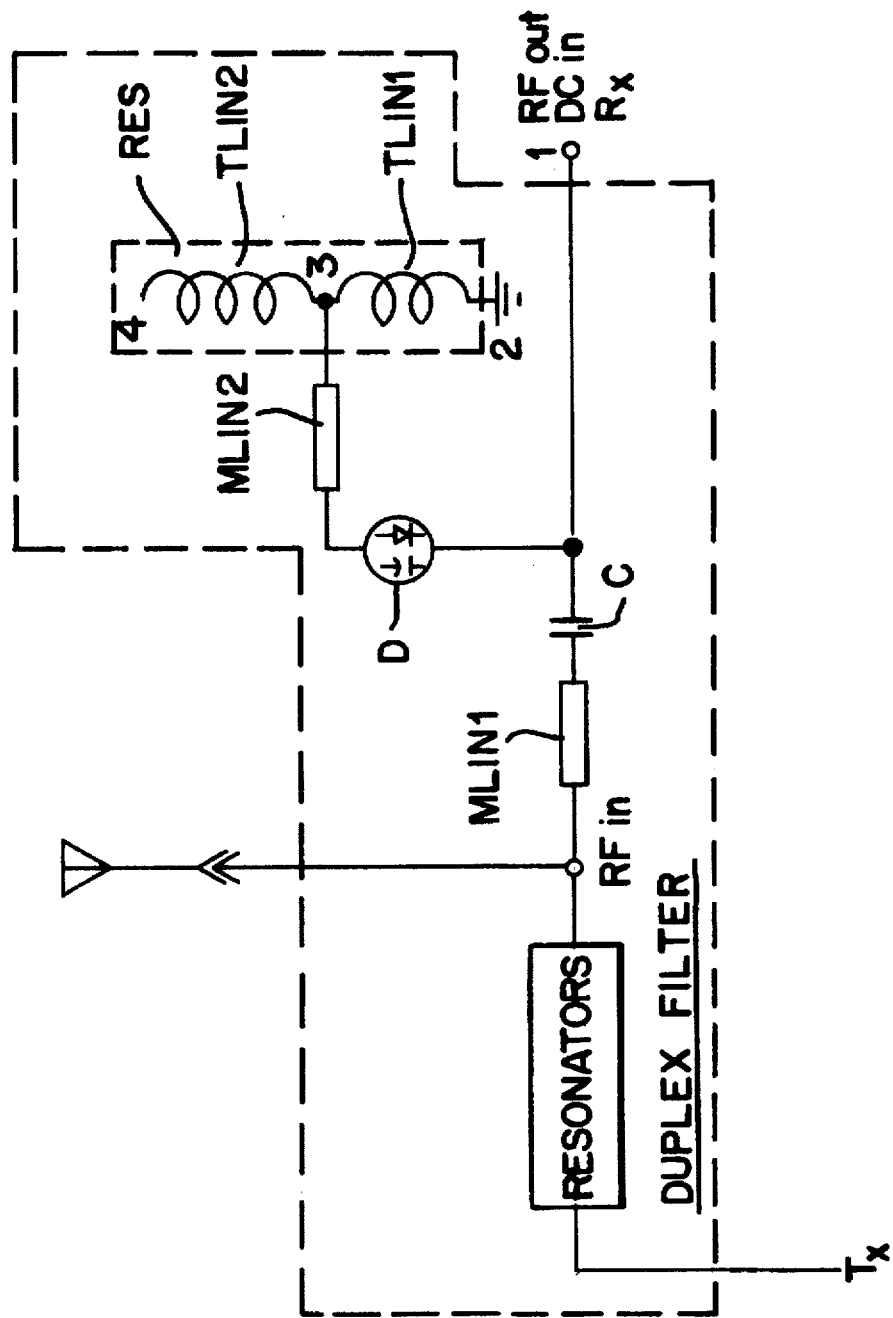
FIG. 1 presents a principle picture of the circuit of the invention.

FIG. 1 shows one resonator of a duplex filter, connected to a bandstop circuit which attenuates the signal causing a spurious response when the local oscillator injection is located on the upper side. The signal frequency causing spurious response is located by half of the intermediate frequency above the receiving frequency. The circuit is formed from a helical resonator Res, a capacitance diode D and a microstrip MLIN2 in series therewith. The microstrip conductor is at one end coupled to the resonator e.g. by tapping at point 3 with the helical resonator Res, which is thus divided into two parts, TLIN1 and TLIN2 and coupled to the diodes D at its other end. The other end of diode D is coupled to point 1 in the main signal circuit of the Rx branch in the duplex filter. In the example shown in the figure, the coupling has been positioned for the last component in the Rx branch, so that the circuit is connected to the Rx gate of the filter. The function of the capacitor C is to prevent the access of direct voltage to the duplex filter proper. A signal to be received from the antenna is fed via the other resonators (not shown) of the duplex filter through the microstrip MLIN1 to point 1, which also serves as the output gate for the Rx of the filter.

Endeavours are made to dimension the circuit so that the series resonance frequency of a resonator connected as a reverse circuit can be controlled from 970 MHz to 990 MHz. While connected to the filter the reverse circuit increases the attenuation of the spurious response signal in the upper part of the pass band, whereby spurious response in the receiver are reduces.

Figure 2:
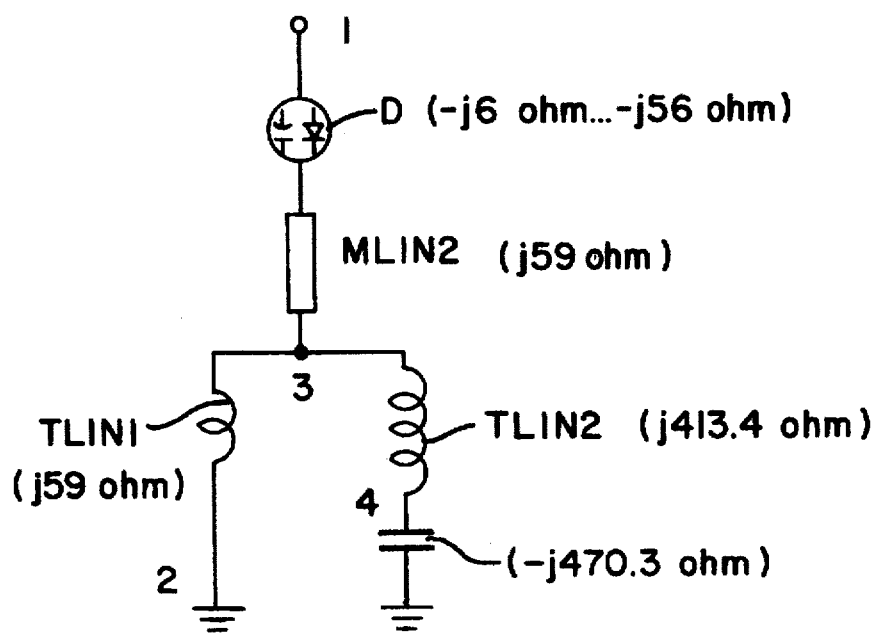
FIG. 2 shows more clarified the circuit of FIG. 1.

The circuit can be shown in a more clarified form, as in FIG. 2. Assume that at 940 MHz frequency the reactance of TLIN1 is j*59 ohms and the reactance of TLIN2 is J*413 ohms. The capacitance of the varactor varies in the range from 27 pF to 3 pF, that is, from −j*6 ohms to −j56 ohms. It is known in the art that the reactance of a resonance circuit, such as a helical resonator Res, is capacitive above its resonance frequency. Hereby, a series resonance is provided by connecting from point 3 a series connection formed by the microstrip conductor MLIN2 and the capacitance diode D against the earth. When attenuation is desired to be at 970 MHz, the capacitive reactance of the resonator Res at that frequency is e.g. 56.1 ohms, whereby the microstrip MLIN2 and the reactance of the series connection of the capacitance diode must be of equal magnitude but of opposite sign in reactance, that is, 56.1 ohms inductive. This is implemented when the inductive reactance of the microstrip is 56.1 ohms, i.e. 62.17 ohms, being about 10 nH when calculated in inductance. Hereby, the resonance circuit is in series resonance at 970 MHz.

The series resonance frequency can be smoothly controlled by changing the capacitance of the capacitance diode, i.e. by varying the magnitude of the direct voltage across the diode. When the magnitude of the capacitance of the varactor is about 3 pF, a desired 990 MHz is obtained for the series resonance frequency. By selecting an appropriate diode with a wide capacitance range, the series resonance frequency can be varied over an even wider range.

Figure 3:
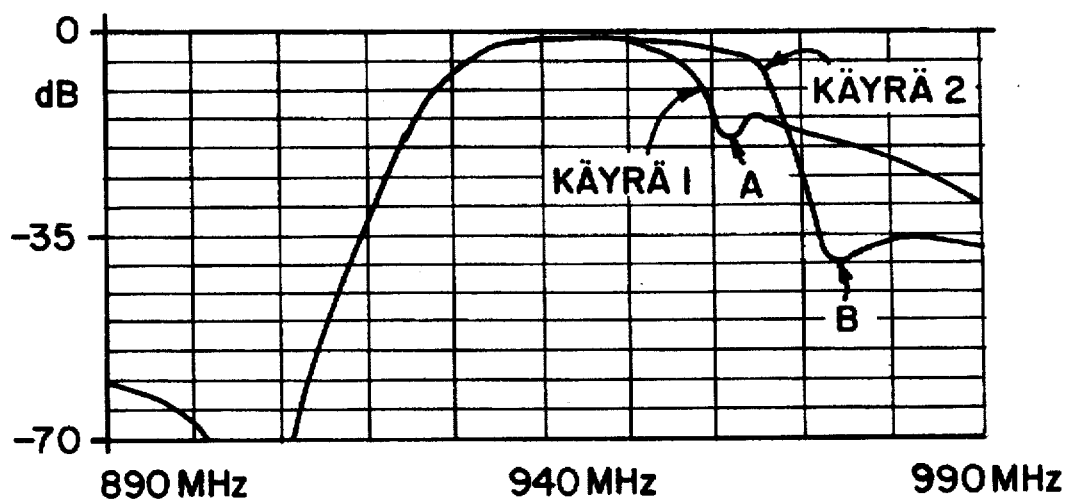

FIG. 3 shows the penetration curve of the Rx branch of e duplex filter intended for the NMT radio phone system using the embodiment of FIG. 1, A controllable resonator has been positioned at the Rx end of a filter as far as possible from the antenna gate in which high transmitter power affects the duplex filter, This results in the transmitter signal being attenuated in the Rx branch of the duplex filter by about 50 dB prior to the controllable circuit operated in accordance with the invention. Thus, the high frequency signal visible in the varactor is very low level, thus having no effect on the behaviour of the circuit to be controlled. If the circuit to be controlled were positioned in the proximity of the antenna gate, the operation of the circuit would be completely disturbed. When the varactor is unbiased (control voltage 0 V), the frequency response of the filter is as shown in curve 1. It is found that the circuit creates about 10 dB attenuation in the range 957.5 MHz to 960 MHz. The series resonance frequency of the circuit is at point A.

When a direct voltage of a few volts is supplied to the varactor, the seriesresonance frequency of the resonator increases and moves to point B, and the frequency response of the Rx branch of the filter is as shown in curve 2. The zero point moves upwards in frequency.

Due to the form of coupling used in the present invention, no changes need be made in the mixer of the radio telephone due to of spurious responses. Thus, using a design in accordance with the invention, the spurious response signal generated in the mixer of the radio telephone can be effectively attenuated without making any changes in the other components, and as a result, significantly improves the performance of the apparatus. If the local Oscillator injection is located on the lower side (the received frequency is higher than the local oscillator frequency), the frequency of the spurious response signal is lower by half of the intermediate frequency than the received frequency. For such a situation, a circuit such as in FIG. 4 can be used. When applicable, the same references are used as in FIG. 1. A zero point is now set (series resonance frequency) below the receiving band. This is carried out by having in addition to the inductance MLIN2, a capacitor C2 is used in the circuit. The DC voltage used for controlling the capacitance of the varactor is supplied to the circuit via resistor R. The series resonance frequency of the circuit is thus produced below the receiving band.

Figure 4:
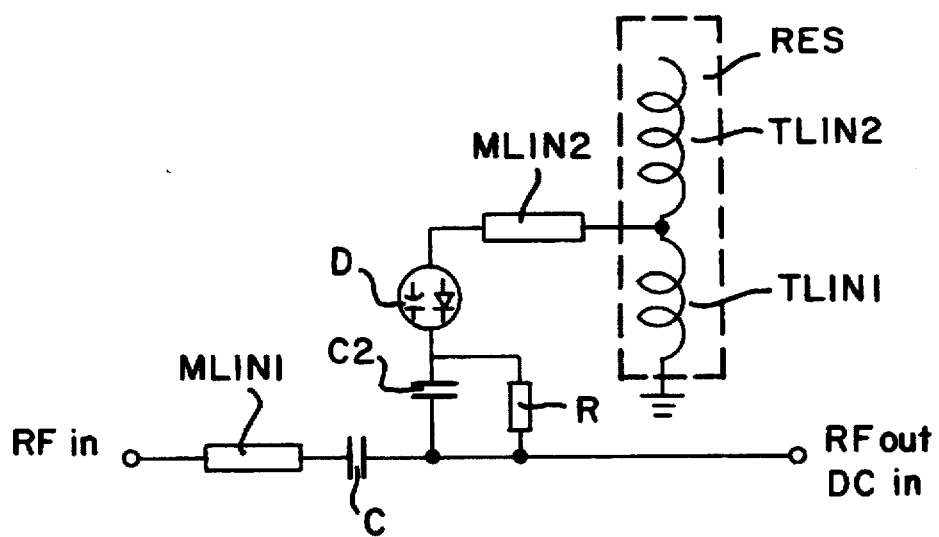
FIG. 4, is a principle figure of a circuit according to second embodiment.
Figure 5:
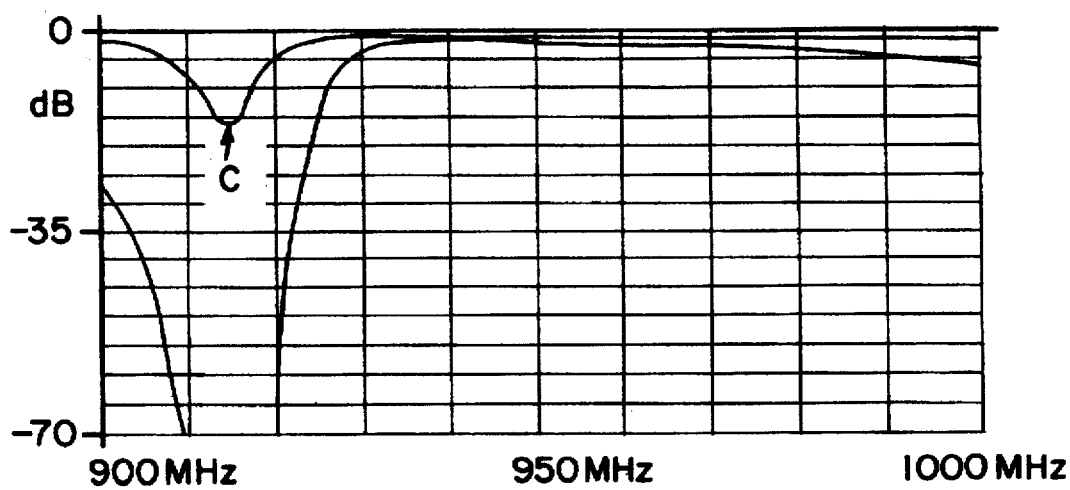
FIG. 5 shows the frequency response of the circuit of FIG. 4.

The amplitude response of a circuit as in FIG. 4 is shown on 10 dB scale in FIG. 5. As can be seen, zero is now at about 915 Mhz frequency, and the frequencies adjacent to said frequency are sufficiently attenuated not to cause spurious response.

By positioning the attenuation circuit of a signal causing spurious response in association with the duplex filter, no extra circuits need be placed in the receiver branch, as is the case in state of the art designs.

The series resonance frequency may, in fact, be controlled steplessly, but it is simple to use two direct voltage states only for the control voltage of the capacitance. When a controllable resonator according to the invention is used in the filter, the direct voltage needed by the varactor can be fed via the Rx signal gate, whereby the mechanical structure of the filter remains externally unchanged and no separate gate is needed for supplying direct voltage. If desired, a separate gate intended for supplying DC voltage may also be used.

By appropriate sizing of the components of the circuit to be controlled, the frequency of the zero point to be controlled can be changed also at the desired frequencies other than at frequencies which cause a spurious response. For instance, e.g. 980–1005 MHz can be sized toe form the control range in which range the local oscillator of a radio telephone operates when using a 45 MHz intermediate frequency. The leakage of the local oscillator into the antenna gate of the apparatus can be prevented by setting the series resonance frequency at the local oscillator frequency used each time. Likewise, for the operation range, a so-called mirror frequency range can be selected, which in the NMT occurs in the range 1025 to 1050 MHz, and therethrough improve the mirror frequency attenuation remarkably.

Helical resonators are used in the examples, but it is equally possible to use LC circuit, coaxial resonator, strip line or equivalent resonator, neither is it necessary to limit the implementation to the examples described above. The circuit can be implemented in a number of different ways while remaining within the protective scope of the claims. The filter need not be a duplex filter, either, and the scope of the invention is appropriate for use in association with any radio frequency filter.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during prosecution of this application or of any such further application derived therefrom.

What I claim is:

1. A duplex radio frequency filter having pass bands, comprising:

a receiving part with a plurality of resonators defining a receiving pass band region, said receiving part being connected between a receiving branch of a radio telephone at an output connector and an antenna;

a transmitting part with a transmission pass band region, said transmitting part being connected between a transmitting branch of a radio telephone and the antenna; and a tunable bandstop filter coupled to the receiving part of the radio telephone at the output connector, the tunable bandstop filter including an electrically tunable resonator which is tunable to attenuate signals in the pass bands of said duplex radio frequency filter, the electrically tunable band stop resonator being disposed in the duplex filter structure at a distance remote from the antenna of the radio telephone such that at least one of said plurality of resonators is situated between said electrically tunable bandstop resonator and the antenna.

2. A duplex radio frequency filter according to claim 1, wherein the resonator of said tunable bandpass filter comprises a plurality of resonators, wherein said resonators are coupled as a series resonance resonator having a series resonance frequency such that an input signal is substantially attenuated, which series resonance frequency can be changed by means of a direct voltage control signal input to said band stop filter, so that at least one value of the control signal causes the series resonance frequency to be located in said receiver pass band.

3. A duplex radio frequency filter according to claim 2, wherein said resonator of said tunable bandstop filter is a transmission line resonator, and filter further comprises:

a series coupled inductive element and a capacitive element comprising a capacitance diode with a cathode, one end of the inductive element being coupled such that the transmission line resonator is divided into two parts and the other end is coupled to the output connector of the radio frequency filter, and means for applying a direct voltage to the cathode of the capacitance diode.

4. A duplex radio frequency filter according to claim 3, wherein a reactance of the series coupled inductive element and the capacitive element is inductive and greater than a capacitive reactance of the transmission line resonator at a frequency higher than a resonance frequency of the transmission line resonator, whereby the series resonance frequency of the band stop filter is located in an upper region of said receiver pass band.

5. A duplex radio frequency filter according to claim 3, wherein a reactance value of the series coupled inductive element and the capacitive element is capacitive and higher than an inductive reactance of the transmission line resonator when operating at a frequency lower than the resonance frequency of the transmission line resonator, whereby the series resonance frequency of the bandstop filter is located in a lower region of and below the receiver pass band.

6. A duplex radio frequency filter according to claim 2, wherein the direct voltage control signal is coupled to the output connector of the receiving part of said radio frequency filter.

7. A duplex radio frequency filter according to claim 6, wherein the output connector is coupled via a resistor to the cathode of the capacitance diode and the capacitance diode is coupled via a capacitor to the output connector of the filter.

8. A duplex radio frequency filter according to claim 3, wherein the inductive means is a strip line.

9. A duplex radio frequency filter according to claim 8, wherein the series resonance frequency of the resonator of said tunable bandstop filter is at a frequency of a signal causing spurious response in the receiving branch.

10. A duplex radio frequency filter according to claim 1, wherein the series resonance frequency of the resonator of said tunable bandstop filter is substantially the same as a frequency of a local oscillator in the receiving branch.

11. A duplex radio frequency filter according to claim 3, wherein the inductive means is a resonator coil.

* * * * *

UNITED STATES PATENT AND TRADEMARK OFFICE
CERTIFICATE OF CORRECTION

PATENT NO. : 5,717,368
DATED : February 10, 1998
INVENTOR(S) : Erkki Niiranen

It is certified that error appears in the above-identified patent and that said Letters Patent is hereby corrected as shown below:

TITLE PAGE:

[75] Inventor: Please delete "Erkki Niiranen, Saukonkuja, Finland" and insert --Erkki Niiranen, Li, Finland--

Signed and Sealed this

Fourteenth Day of April, 1998

Attest:

BRUCE LEHMAN

*Attesting Officer*    *Commissioner of Patents and Trademarks*

UNITED STATES PATENT AND TRADEMARK OFFICE
CERTIFICATE OF CORRECTION

PATENT NO. : 5,717,368
DATED : February 10, 1998
INVENTOR(S) : Erkki NIIRANEN

It is certified that error appears in the above-identified patent and that said Letters Patent is hereby corrected as shown below:

On the title page, item
[75] Inventor: Please change "Li" to -- Ii" --.

Signed and Sealed this

Twenty-first Day of July, 1998

*Attest:*

BRUCE LEHMAN

*Attesting Officer*     *Commissioner of Patents and Trademarks*